(12) United States Patent
Baillin

(10) Patent No.: US 9,554,471 B2
(45) Date of Patent: Jan. 24, 2017

(54) STRUCTURE WITH SEVERAL CAVITIES PROVIDED WITH ACCESS CHANNELS OF DIFFERENT HEIGHTS

(71) Applicant: Commissariat A L'Energie Atomique et aux Energies Alternatives, Paris (FR)

(72) Inventor: Xavier Baillin, Crolles (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 40 days.

(21) Appl. No.: 14/725,028

(22) Filed: May 29, 2015

(65) Prior Publication Data

US 2015/0351246 A1 Dec. 3, 2015

(30) Foreign Application Priority Data

Jun. 3, 2014 (FR) ...................................... 14 55019

(51) Int. Cl.
*H05K 1/11* (2006.01)
*H05K 1/14* (2006.01)
(Continued)

(52) U.S. Cl.
CPC .................. *H05K 1/183* (2013.01); *B32B 3/30* (2013.01); *B32B 37/18* (2013.01); *B32B 38/0004* (2013.01); *B32B 38/0008* (2013.01); *B81B 7/02* (2013.01); *B81C 1/00293* (2013.01); *B32B 2439/00* (2013.01); *B32B 2457/00* (2013.01); *B81B 2201/0235* (2013.01); *B81B 2201/0242* (2013.01); *B81C 2203/0136* (2013.01);
(Continued)

(58) Field of Classification Search
USPC ......................................... 361/784, 748, 785
See application file for complete search history.

(56) References Cited

U.S. PATENT DOCUMENTS 8,035,209 B2 10/2011 Gonska et al.
8,350,346 B1 1/2013 Huang et al.
(Continued)

FOREIGN PATENT DOCUMENTS

EP 2 451 740 B1 10/2013

OTHER PUBLICATIONS

U.S. Appl. No. 14/555,913, filed Nov. 28, 2014, Xavier Baillin.
(Continued)

*Primary Examiner* — Andargie M Aychillhum
(74) *Attorney, Agent, or Firm* — Oblon, McClelland, Maier & Neustadt, L.L.P.

(57) ABSTRACT

A packaging structure including:
a cover secured to a first substrate and forming first and second distinct cavities between the cover and the first substrate,
first and second channels formed in the first substrate and/or in the cover and/or between the first substrate and the cover, the first channel including a first end leading into the first cavity and a second end leading off the first cavity via a first hole passing through the cover, the second channel including a first end leading into the second cavity and a second end leading off the second cavity via a second hole passing through the cover,
a height $H_A$ of the first channel at its second end is lower than a height $H_B$ of the second channel at its second end.

14 Claims, 4 Drawing Sheets

(51) Int. Cl.
*H05K 1/18* (2006.01)
*B32B 3/30* (2006.01)
*B32B 37/18* (2006.01)
*B32B 38/00* (2006.01)
*B81C 1/00* (2006.01)
*B81B 7/02* (2006.01)

(52) U.S. Cl.
CPC ........... *B81C 2203/0145* (2013.01); *H05K 2201/09036* (2013.01)

(56) References Cited

U.S. PATENT DOCUMENTS

| | | |
|---|---|---|
| 8,590,376 B2 | 11/2013 | Reinert et al. |
| 2008/0211076 A1 | 9/2008 | Nishiuchi et al. |
| 2008/0308919 A1 | 12/2008 | Obata et al. |
| 2010/0001361 A1 | 1/2010 | Caplet et al. |
| 2010/0003789 A1* | 1/2010 | Caplet ............ B81C 1/00285 438/124 |
| 2011/0079425 A1 | 4/2011 | Baillin et al. |
| 2012/0052313 A1* | 3/2012 | Sibuet ............ B81C 3/001 428/457 |
| 2012/0112293 A1 | 5/2012 | Pornin et al. |
| 2012/0326248 A1 | 12/2012 | Daneman et al. |
| 2012/0328779 A1 | 12/2012 | Caplet et al. |
| 2013/0207281 A1 | 8/2013 | Baillin et al. |
| 2013/0265701 A1 | 10/2013 | Takizawa |
| 2014/0008738 A1 | 1/2014 | Morris, III et al. |
| 2014/0038364 A1 | 2/2014 | Nicolas et al. |
| 2015/0028433 A1 | 1/2015 | Baillin et al. |

OTHER PUBLICATIONS

U.S. Appl. No. 14/408,478, filed Dec. 16, 2014, Xavier Baillin et al.
French Preliminary Search Report issued Feb. 16, 2015 in French Application 14 55019, filed on Jun. 3, 2014 ( with English Translation of Categories of Cited Documents).

* cited by examiner

STRUCTURE WITH SEVERAL CAVITIES PROVIDED WITH ACCESS CHANNELS OF DIFFERENT HEIGHTS

TECHNICAL FIELD AND PRIOR ART

The invention relates to the field of packaging structures including several cavities advantageously intended to include different atmospheres, and wherein different micro-devices, for example of the MEMS, NEMS, MOEMS, NOEMS type, or micro-bolometer type infrared detectors, are advantageously intended to be hermetically packaged.

Some micro-devices require for their good working order to be enclosed in a cavity the atmosphere of which (in terms of nature of the gases and pressure) is controlled. For this, it is possible to make these micro-devices collectively on wafers, or substrates, of silicon and then to package them in cavities via a transfer of a cover corresponding generally to another silicon or glass substrate (Wafer to Wafer assembly also called W2W assembly), or via packaging by one or more superimposed thin layers deposited onto a sacrificial layer which, after destruction, forms free volumes between the substrate and the thin layers forming the cavities (Thin Film Packaging also called TFP). The hermetic cavities thus defined enable atmospheres which surround the micro-devices in the cavities to be preserved towards the external atmosphere.

The addition of a thin layer getter previously deposited on the or one of the substrates before making a cavity, enables the atmosphere to be controlled in the cavity. Thus, making a cavity including a micro-device under a controlled atmosphere generally includes depositing a getter onto either or both substrates prior to the assembly operation for the W2W technology or, in the case of a TFP technology, depositing the getter either at a first level of the substrate for accommodating the micro-device or directly in the form of a first packaging layer. It is possible to obtain by this technique a minimum residual gas pressure in the cavity, for example between about $10^{-3}$ and $10^{-4}$ mbar. The addition of a rare gas (argon for example) during the operation of closing the cavity and in the presence of a getter enables residual pressures higher than these values to be controlled.

Some micro-devices, for example inertial micro-devices having six degrees of freedom, including in particular an accelerometer and a gyrometer in a same chip, require a specific packaging method since each of the micro-devices is packaged in a distinct hermetic cavity under a controlled atmosphere because both micro-devices operate at different pressures. To hermetically close at least two cavities under different atmospheres, there are several solutions which are generally applicable for a W2W type packaging and, in some cases, to a TFP type packaging.

Document U.S. Pat. No. 8,590,376 B2 describes a device including two sensors each packaged in a distinct cavity, the cavities being obtained by a W2W type packaging. The nature of the gases and/or the pressure within the cavities are individually controlled in each cavity by providing a getter in one of the cavities and by not providing a getter in the other cavity, or by providing, in the cavities, getters having different absorption properties.

Because the sealing of the cavities is made during the assembly of both wafers, it is difficult to control the quality of the residual atmosphere (nature of the gases and pressure). Indeed, this is related to the technological methods prior to the assembly which generate gas adsorptions in particular on the cavity walls. Reproducibility problems thus arise in this case. This solution thus enables pressures between about $10^{-4}$ mbar and several mbar of an uncontrolled atmosphere to be obtained.

Document U.S. Pat. No. 8,350,346 B1 suggests to create cavities having different volumes. Thus, for a same closing pressure, residual pressures will directly depend on the ratio of the volumes of the cavities because the area/volume ratio decreases when the cavity is deeper, thus providing a lower pressure for the cavity having the greatest depth. However, since the possible volume variation between the cavities is restricted, the differences in pressure that can be obtained within the cavities are also restricted (difference by a 2 or 3 maximum factor). Moreover, a degassing process occurs upon closing the cavities, which relies on species adsorbed at the surfaces of the cavities, which causes reproducibility problems.

Documents U.S. Pat. No. 8,035,209 B2 and US 2014/0008738 A1 suggest to close both cavities during a same operation, and then to open at least one of both cavities to reclose it thereafter under a different pressure via depositing a thin film. Also described is the possibility to make, through a first packaging layer, holes accessing to both cavities, the dimensions of the holes being different for both cavities. Thus, a first deposition of a thin layer enables the holes having the smallest dimensions to be obstructed and the cavity associated with these holes to be hermetically closed, whereas a second deposition then enables the other cavity to be hermetically closed.

However, this method requires the implementation of many steps in comparison with other methods. Moreover, there is a pollution risk inside the cavities, in particular at that including the holes having the largest dimensions upon depositing the first packaging layer. Finally, when this method is applied for a TFP type packaging, it has the drawback to also create a deposition into the cavities, which can affect the good working order of the device or which requires a suitable design to avoid this drawback.

Document US 2012/0326248 A1 describes four solutions to make several cavities including different atmospheres.

The first solution relies on the creation of a first cavity before creating a second cavity during the assembly step. The first cavity is plugged using deposition methods on a pre-existing cavity.

The second solution relies on the control of the assembly cycles between the wafers, and suggests three technologies. The first technology involves sealing beads having different melting temperatures. Thus, during a first melting, it is possible to close a first set of cavities under a given atmosphere, and then by increasing the temperature, to close a second set of cavities under another atmosphere. The second technology relies on the use of a same sealing material, but of different bead designs. For the first cavities, the beads are continuous, whereas for the second cavities, the beads have an opening which enables a leak between the inside of the cavity and the sealing chamber to be created. Therefore, it is possible to close the first cavities under a given atmosphere, and then to change the atmosphere and to further press against the assembly so as to close the second cavities. The third technology uses a degasser material or getter, which is introduced in at least one cavity prior to assembly. It is activated either as a degasser, or as a getter under the action of temperature. The essential difficulties of this technology are however the control of the final pressure as well as the reproductibility, because it is difficult to accurately control the gas content in the degasser material. The fourth technology involves sealing beads with different heights on one of both wafers to be assembled. They are for example thicker on the perimeter of the first cavities, in comparison with the second cavities. It is thus possible to close the first cavities under a first atmosphere, and then the second ones under another atmosphere.

The third solution implements the creation of a reservoir in the pre-cavities machined in the first substrate. These pre-cavities, apart from the zone of the reservoir, are in communication with the ambient atmosphere. The final cavities are formed on the pre-cavities upon assembly between the substrates. Opening the reservoir then enables the cavity to be filled with the reservoir gas.

The fourth solution uses the post-assembly creation of a channel leading either onto one of the cavities or in the proximity thereof, whereas the other cavities have been closed upon assembly. In this case, the channel leads onto a layer of silicon oxide which is located on the periphery of the cavity and the gas permeation resistance of which is known. It is thus possible to control this cavity's filling with a given atmosphere, and then to plug the channel with a suitable deposition.

All of these solutions require either numerous technological steps, or use, at least in one cavity, a residual pressure coming directly from the assembly cycle, thus causing reproductibility problems.

Document US 2014/0038364 A1 suggests to create diffusion windows having different cross-sections in the cover (in particular for a helium permeable glass cover, the diffusion windows are defined by a metal mask, impermeable to helium diffusion, deposited onto the cover). These windows are defined once the hermetic cavities are sealed and the gas is introduced into the cavities by exposing the component to a gas controlled pressure, for a defined time and at a defined temperature. Once the cavities are filled at the wanted pressure, a hermetic film is deposited in order to close the windows.

This solution implies, however, to control the residual atmosphere in the cavities after the assembly of the substrates. Therefore, it is possible to encounter problems of uniformity on a same wafer and of reproducibility from a wafer to another. Moreover, this technique is only applicable for a cover permeable to some gases, which restricts the choice of the nature of the cover and gases.

DISCLOSURE OF THE INVENTION

Thus there is a need to provide a packaging structure including several cavities in which different atmospheres (in terms of gas nature and pressure) can be obtained and not having the drawbacks of the previously described structures of prior art.

For this, one embodiment provides a packaging structure including:
- at least one cover secured to at least one first substrate and forming at least first and second distinct cavities between the cover and the first substrate,
- at least first and second channels formed in the first substrate and/or in the cover and/or between the first substrate and the cover, such that the first channel includes a first end leading into the first cavity and a second end leading off the first cavity via at least one first hole formed through the cover, and in that the second channel includes a first end leading into the second cavity and a second end leading off the second cavity via at least one second hole formed through the cover, wherein a height $H_A$ of the first channel at its second end is lower than a height $H_B$ of the second channel at its second end.

Each cavity is provided with at least one channel enabling communication between the inside of the cavity and the outside of the same. Because the height $H_A$ of the first channel is lower than that (height $H_B$) of the second channel, this first channel can thus be closed before the second channel for example by depositing a first closing layer the thickness of which is higher than the height $H_A$ and lower than the height $H_B$, thus only closing the first cavity at the desired atmosphere without closing the second cavity. The second cavity can then be closed with another atmosphere independently of that in the first cavity.

The packaging structure has the following advantages:
- it enables several closed cavities to be made with controlled atmospheres in each of them and independent from each other;
- the pressure ranges that can be obtained in the cavities are large, and can for example range to about $10^{-6}$ mbar;
- no restriction about possible deviations between the pressures with which the cavities can be closed;
- a good reproducibility of the atmospheres with which the cavities can be closed;
- a reduced number of steps to perform the closure of the cavities;
- little or no pollution risk inside the cavities, in particular by the materials used to close the cavities;
- no restriction on the nature of the gases that can be enclosed in the cavities.

The height, or thickness, of a channel can correspond to a dimension of said channel which is substantially perpendicular to a main direction along which said channel extends (for example, in the case of a rectilinear channel, the channel extends along a main direction from the first end to the second end of the channel). The height can for example correspond to a dimension of the channel which is substantially perpendicular to a main face of the first substrate, for example the face of the first substrate on which the cover is located. The height can for example correspond to a dimension of the channel which is substantially perpendicular to a main face of the cover, in particular in the case of a channel formed in the cover, and/or to a main face of the first substrate.

The height $H_A$ of the first channel can be substantially constant throughout the length of the first channel, that is between its first end and its second end. The height $H_B$ of the second channel can be substantially constant throughout the length of the second channel.

The difference between the heights $H_A$ and $H_B$ may be such that it is possible to close the first channel via depositing a closing layer at the second ends of the first and second channels without closing the second channel. Such a difference in heights between the channels does not correspond to a difference in heights generated by inaccuracies due to the making of the channels.

The first hole may include, at a front face of the cover (face opposite to that facing or against the first substrate), a section belonging to a plane substantially perpendicular to the height of the first channel. Likewise, the second hole may include, at the front face of the cover, a section belonging to a plane substantially perpendicular to the height of the second channel.

The first and second channels may form lateral vents (that is leading to the side of the cavities) having different heights.

The packaging structure may be advantageously used to perform a common packaging of several micro-devices intended to operate under different atmospheres, that is at different pressures and/or in different gas environments.

The channels may be made at the edges of the cavities, in particular when the channels are formed in the first substrate and/or between the first substrate and the cover, and therefore cannot be provided perpendicular to micro-devices provided in the cavities, which prevents them from being polluted or damaged upon closing the cavities.

The second end of the first channel may be plugged by at least one first portion of a first closing layer with a thickness $E_1$ higher than the height $H_A$ and lower than the height $H_B$, and the second end of the second channel may be plugged by at least:
- one second portion of the first closing layer and a portion of a second closing layer with a thickness $E_2$ such that $H_B<(E_1+E_2)$, or
- the second portion of the first closing layer and a portion of a material soldered to the second portion of the first closing layer and with a thickness $E_2$ such that $H_B<(E_1+E_2)$, or
- the second portion of the first closing layer and a portion of a plugging layer plugging the second hole on the cover.

The first and second closing layers may be, independently of one another, single-layered or multilayered. Likewise, the plugging layer may be single-layered or multilayered, and deposited on all or part of the cover such that at least one portion of this plugging layer obstructs the second hole formed through the cover.

At least one first micro-device may be provided in the first cavity and/or at least one second micro-device may be provided in the second cavity. The first and/or second micro-devices may be of the MEMS, NEMS, MOEMS, NOEMS type, or micro-bolometer type infrared detectors.

The packaging structure may be such that:
- when the first micro-device is provided in the first cavity, the first closing layer includes at least one electrically conductive material, the packaging structure including at least one first electrical connection element connected to the first micro-device and to the first portion of the first closing layer, and at least one first electrical contact provided at least partly in the first hole and connected to the first portion of the first closing layer, and/or
- when the second micro-device is provided in the second cavity, the materials plugging the second end of the second channel are electrically conductive, the packaging structure including at least one second electrical connection element connected to the second micro-device and to the second portion of the first closing layer, and at least one second electrical contact provided at least partly in the second hole and connected to the portion of the second closing layer or to the portion of the material soldered to the second portion of the first closing layer.

Thus, at least one of the micro-devices may be electrically accessible from the front face of the packaging structure via the first and/or second electrical contact. The first and/or second electrical contact may in particular extend along the first and/or second holes and also on the cover.

The first channel may pass through at least one side wall of the first cavity and/or the second channel may pass through at least one side wall of the second cavity.

The cover may include at least a substrate called a second substrate secured to the first substrate and such that the first and second cavities are formed at least partly in the second substrate. Such a packaging structure may be made by a W2W type method. The first and/or second channels may be formed in the second substrate.

In this case, the second substrate may be secured to the first substrate via a bonding interface provided between the first substrate and the second substrate and such that the first and second channels are formed at least partly in the bonding interface. In this configuration, it is also possible that the channels are formed in the bonding interface as well as in the first substrate and/or the second substrate.

The cover may include at least one thin layer provided on the first substrate, and the first and second channels may be formed at least in the first substrate. Such a packaging structure may be made by a TFP type method. The term "thin layer" here refers to a layer of material the thickness of which is lower than or equal to about 20 μm.

The cover may include at least two thin layers superimposed above each other and provided on the first substrate, and the first and second channels may be formed at least by spaces between both thin layers. Such a packaging structure may be made by a TFP type method.

Another embodiment relates to a method for making a packaging structure, including making at least one cover secured to at least one first substrate forming at least first and second distinct cavities between the cover and the first substrate, and making at least first and second channels in the first substrate and/or in the cover and/or between the first substrate and the cover, such that the first channel includes a first end leading into the first cavity and a second end leading off the first cavity via at least one first hole formed through the cover, and in that the second channel includes a first end leading into the second cavity and a second end leading off the second cavity via at least one second hole formed through the cover, wherein a height $H_A$ of the first channel at its second end is lower than a height $H_B$ of the second channel at its second end.

The method may further include, after making the cover and the first and second channels, depositing at least one first closing layer with a thickness $E_1$ higher than the height $H_A$ and lower than the height $H_B$ such that at least one first portion of the first closing layer plugs the second end of the first channel, and then:
- depositing at least one second closing layer with a thickness $E_2$ such that $H_B<(E_1+E_2)$ and that at least one second portion of the first closing layer and a portion of the second closing layer plugs the second end of the second channel, or
- depositing at least one portion of soldering material with a thickness $E_2$ such that $H_B<(E_1+E_2)$ onto the second portion of the first closing layer, and then soldering the portion of soldering material, or
- making at least one portion of plugging layer which plugs the second hole on the cover.

Making the cover and the first and second channels may also include the implementation of the following steps of:
- making first and second channels at a face of a second substrate intended to be secured to the first substrate;
- making first and second cavities at said face of the second substrate;
- securing said face of the second substrate to the first substrate;
- making first and second holes through the second substrate, wherein the first channel passes at least through a side wall of the first cavity and/or wherein the second channel passes at least through a side wall of the second cavity.

It is possible to make the holes, open or blind, just after the channels. Thus, the holes, channels and cavities can be pre-machined in the cover for a W2W type packaging prior to securing the substrates to each other, which enables any wet technological operation to make these elements post-securing to be avoided.

Alternatively, making the cover and the first and second channels may include at least the implementation of the following steps:

making first and second cavities at one face of the second substrate intended to be secured to the first substrate;
  making a bonding interface on said face of the second substrate and/or on a face of the first substrate to which the second substrate is intended to be secured, the first and second channels being formed at least partly in the bonding interface;
  securing said face of the second substrate to the first substrate via the bonding interface;
  making the first and second holes through the second substrate.

Once again, the holes may be made just after the channels. Thus, the holes, channels and cavities can be made prior to securing the substrates to each other, which enable any wet technological operation to make these elements post-securing to be avoided.

According to another alternative, making the cover and the first and second channels may include at least the implementation of the following steps:

making the first and second channels in the first substrate;
  making first and second portions of sacrificial material on the first substrate, volumes of which correspond to those of the first and second cavities and such that the first portion of sacrificial material covers at least one part of the first channel and that the second portion of sacrificial material covers at least one part of the second channel;
  depositing at least one thin layer onto the first and second portions of sacrificial material;
  making the first and second holes through the thin layer;
  etching the first and second portions of sacrificial material through the first and second holes.

In this case, the channels are made in the first substrate prior to making the cover by a TFP type method. This enables in particular a wet technological operation to be avoided when the cavities are opened.

According to another alternative, making the cover and the first and second channels may include at least the implementation of the following steps:

making first and second portions of sacrificial material on the first substrate, volumes of which correspond to those of the first and second cavities;
  depositing at least one first thin layer onto the first and second portions of sacrificial material;
  making third and fourth holes through the first thin layer, the third hole being formed at a location of the first end of the first channel intended to be made and the fourth hole being formed at a location of the first end of the second channel intended to be made;
  making, on the first thin layer, at least one third portion of sacrificial material a thickness of which is equal to the height $H_A$, at least at a location of the first channel, and at least one fourth portion of sacrificial material a thickness of which is equal to the height $H_B$, at a location of the second channel;
  depositing at least one second thin layer onto the first thin layer, covering the third and fourth portions of sacrificial material;
  making first and second holes through the second thin layer;
  etching first, second, third and fourth portions of sacrificial material through at least the first and second holes.

BRIEF DESCRIPTION OF THE DRAWINGS

The present invention will be better understood upon reading the description of exemplary embodiments given by way of purely and in no way indicating purposes making reference to the appended drawings in which.

Identical, similar or equivalent parts of the different figures described hereinafter bear the same reference numerals so as to facilitate moving from one figure to the other.

The different parts represented in the figures are not necessarily drawn to an uniform scale, to make the figures more legible.

Different possibilities (alternatives and embodiments) should be understood as not being mutually exclusive and can be combined with one another.

DETAILED DISCLOSURE OF PARTICULAR EMBODIMENTS

Figure 1A:
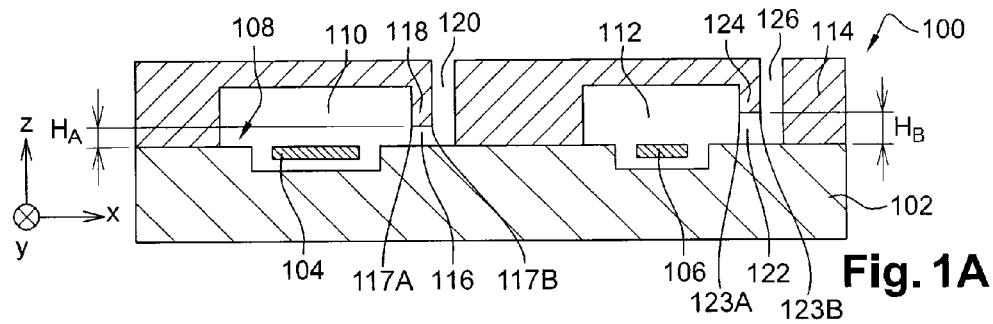
FIGS. 1A and 1B schematically represent a packaging structure according to a first embodiment.
Figure 1B:
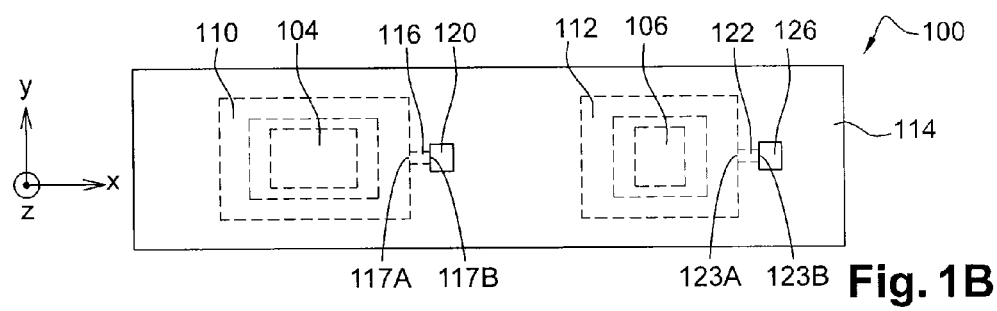

FIGS. 1A and 1B which schematically represent a packaging structure 100 according to a first embodiment is first referred to (FIG. 1A is a profile cross-section view and FIG. 1B is a top view of the structure 100).

The structure 100 includes a first substrate 102 including for example a semi-conductor such as silicon, or glass. Two micro-devices 104 and 106 are made at a front face 108 of the substrate 102. The micro-devices 104 and 106 are provided in different cavities, namely a first cavity 110 for the first micro-device 104 and a second cavity 112 for the second micro-device 106. The cavities 110 and 112 are formed in a cover 114 corresponding to a second substrate, for example of semi-conductor or glass, secured to the substrate 102 at its front face 108. The structure 100 here corresponds to a structure obtained by a W2W type packaging method. The cover 114 advantageously includes a single crystal semi-conductor able to be anisotropically etched in order to be structured in the three dimensions.

Each of the cavities 110 and 112 communicates with the environment external to the structure 100 via a channel extending through a side wall of the cavity formed in the cover 114, and a hole made through the cover 114 and enabling communication between the channel and the outside of the structure 100. In the example of FIGS. 1A and 1B, a first channel 116 passes through a side wall 118 of the cavity 110 and leads into the cavity 110 at a side thereof, at a first end 117A of the channel 116. At a second end 117B of the channel 116, the latter communicates with a first hole 120 formed through the entire thickness of the cover 114.

Likewise, a second channel 122 passes through a side wall 124 of the cavity 112 and leads into the cavity 112 at a side thereof, at a first end 123A of the channel 122. At a second end 123B of the channel 122, the latter communicates with a second hole 126 formed through the entire thickness of the cover 114. The holes 120 and 126 have, for example in a plane perpendicular to the direction along which these holes extend (these holes extend along a direction parallel to the Z axis in FIGS. 1A and 1B), cross-sections of any shape (circular, polygonal, etc.) and dimensions (for example the diameter in the case of circular holes) between about a few µm (less than 10 µm) and 100 µm.

In this example, the channels 116 and 122 are rectilinear and extend along a direction substantially parallel to the X axis represented, from the first end 117A, 123A to the second end 117B, 123B, this direction being perpendicular to the direction along which the holes extend. The channels 116 and 122 horizontally extend through the side walls 118 and 124, that is extend along a direction parallel to the face of the cover 114, which face is secured to the front face 108 of the substrate 102. Moreover, the channels 116 and 122 are here made at the interface between the cover 114 and the substrate 102, and are thus bounded by the side walls 118 and 124 as well as by the front face 108 of the substrate 102. In this exemplary embodiment, the holes 120 and 126 vertically extend through the cover 114, that is perpendicularly to the face of the cover 114, which face is secured to the front face 108 of the substrate 102 and also perpendicularly to the other face of the cover 114 at which the holes 120 and 126 lead (in parallel with the Z axis in FIGS. 1A and 1B).

In order to be able to successively close the cavities 110 and 112 with different atmospheres (pressure and/or nature of the gas(es)), the channels 116 and 122 are made so as to have different heights (the height corresponding to the dimension perpendicular to the direction along which the channel extends, that is the dimension parallel to the Z axis). In the example of FIGS. 1A and 1B, the channel 116 is made with a height $H_A$ which is chosen as being lower than a height $H_B$ of the channel 122. Advantageously, the difference in the heights $H_A$ and $H_B$ is higher than the inaccuracies related to their making, and generally higher than about 0.1 µm. The heights $H_A$ and $H_B$ are for example between about 0.1 µm and 10 µm. The channels 116 and 122 include, in the plane perpendicular to their height (plane parallel to the plane (X, Y)), dimensions, that is a length and a width, that can range between about 0.5 µm and several tens microns, even several hundreds microns. Each of the channels 116, 122 has for example, in the plane (Y, Z), a rectangular or polygonal shaped cross-section.

Figure 2:
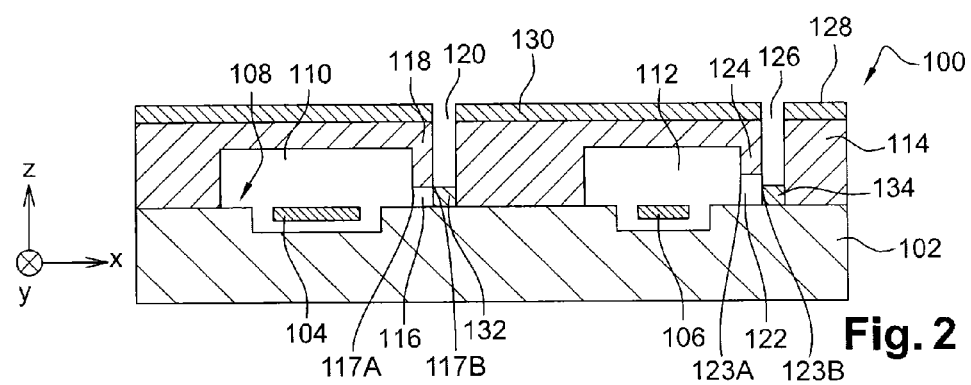
FIGS. 2 and 3 schematically represent steps of closing the cavities of the packaging structure according to the first embodiment.

FIG. 2 represents a first step implemented upon hermetically closing the cavities 110 and 112. During this first step, a first closing layer 128 is deposited, for example through a PVD deposition, onto the structure 100. Parts 130 of this layer 128 are deposited onto the cover 114 and other parts 132, 134 are deposited into the holes 120 and 126. For the deposition of this layer 128 to hermetically close the cavity 110 but not to close the cavity 112, the thickness $E_1$ of the layer 128 is chosen such that $H_A<E_1<H_B$. Thus, the part 132 deposited into the hole 120 has a thickness $E_1$ higher than the height $H_A$ of the channel 116 and hermetically plugs the channel 116 at its second end 117B located on the side of the hole 120. The part 134 deposited into the hole 126 does not plug the channel 122 the height $H_B$ of which is higher than the thickness $E_1$. This step of depositing the layer 128 is implemented under an atmosphere corresponding to that desired in the cavity 110, in terms of nature of the gas and pressure, for this atmosphere to end up in the cavity 110 after depositing the layer 128.

Figure 3:
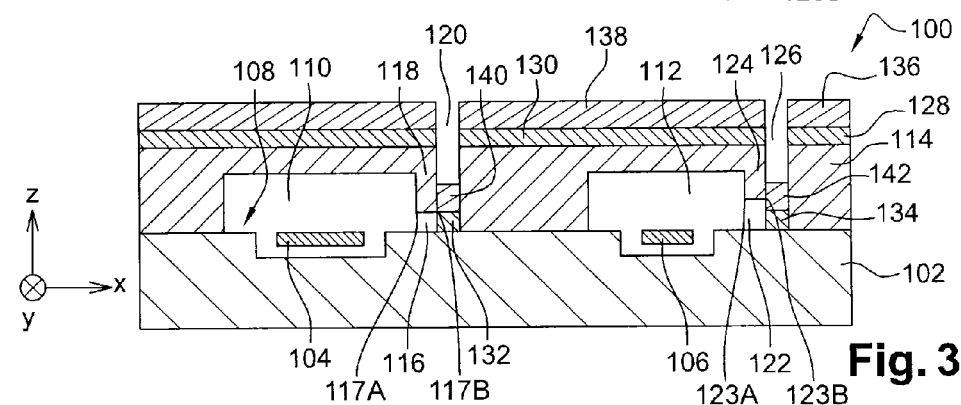

FIG. 3 represents a second step implemented upon hermetically closing the cavities 110 and 112. During this second step, a second closing layer 136 is deposited onto the layer 128. Thus, parts 138 of this layer 136 are deposited at the cover 114, onto the portions 130 of the layer 128, and other parts 140, 142 are deposited into the holes 120 and 126, respectively onto the parts 132 and 134 of the layer 128. For the deposition of this layer 136 to hermetically close the cavity 112 (the cavity 110 being already hermetically closed by the part 132 of the layer 128), the thickness $E_2$ of the layer 136 is chosen such that $H_B<(E_1+E_2)$. Thus, the part 142 of the layer 136 deposited into the hole 126 and the part 134 of the layer 128 hermetically plug the channel 122, at its second end 123B located on the side of the hole 126, the height $H_B$ of which is lower than the sum of the thicknesses $E_1$ and $E_2$. This step of depositing the layer 136 is implemented under an atmosphere corresponding to that desired in the cavity 112, in terms of nature of gas and pressure, for this atmosphere to end up in the cavity 112 after depositing the layer 136.

Both layers 128 and 136 have for example thicknesses $E_1$ and $E_2$ each between about 0.1 µm and 10 µm, and include for example a metal or any other material capable of being deposited at a controlled gas pressure. To hermetically close at least one of the cavities 110, 112 under a high vacuum, the layer(s) 128, 136 is (are) preferably deposited through secondary vacuum evaporation where the pressure in the deposition chamber can be between about $10^{-8}$ and $10^{-5}$ mbar. When at least one of the cavities 110, 112 is closed by controlling a partial pressure of neutral gas such as argon, the layer(s) 128, 136 can be deposited onto the structure 100 by spraying, which enables a pressure range between about $10^{-6}$ and $10^{-1}$ mbar to be covered with deposition thicknesses between about 0.1 µm and 10 µm.

Prior to implementing the steps of depositing the layers 128 and 136, the structure 100 is for example made by the implementation of the steps described below.

The micro-devices 104 and 106 are first made in and/or on the substrate 102.

The channels 116 and 122 are then made by photolithography and etching of the second substrate (for example a RIE, reactive ion etching, when the second substrate includes silicon). The channels 116 and 122 are made at the face of the second substrate which is intended to be secured to the substrate 102.

The cavities 110 and 112 are then made by photolithography and etching (for example a DRIE, deep reactive ion etching, in the case of a second substrate of silicon) through the same face of the second substrate at which the channels 116 and 112 have been made. The cavities made can have a same height, or depth, that is a same dimension from said face of the second substrate to the bottom wall of the cavity. In this case, if these cavities are intended to have different volumes, it is possible that the planar dimensions of these cavities, that is the dimensions in the plane of the face of the second substrate which is intended to be secured to the substrate 102, are different. Alternatively, it is possible to use several levels of photolithography and etching enabling, at equal planar dimensions, the depth, or height, of the cavities to be modulated.

After making the channels 116, 122 and the cavities 110, 112, a deposition of a dielectric layer on the entire surface of the second substrate is advantageously made, for example by implementing a thermal oxidation in the case of a second substrate including silicon and thus forming a SiO$_2$ layer, for example with a thickness in the order of one micron, at the surface of the second substrate.

A W2W type packaging is then performed by securing the second substrate to the substrate 102 for example by:
- a metal sealing by heat compressing and melting a soldering eutectic alloy provided between both substrates, the eutectic alloy being for example AuSn (melting temperature of 280° C.), or AuSi (melting temperature of 363° C.), or AlGe (melting temperature of 419° C.);
- direct sealing by metal bonding without melting between metal portions formed beforehand on the substrates (for example Cu/Cu, or Au/Au, or Ti/Ti, or W/W bonding);
- direct sealing, or direct bonding (or bonding by molecular adhesion), between both silicon substrates, or between one of both substrates comprising silicon and the other one comprising glass;
- anodic sealing when one of both substrates is of silicon and the other substrate is of glass.

Advantageously, the sealing is made under a vacuum as low as possible (for example a few $10^{-5}$ mbar) so as to promote degassing of the cavities prior to closing thereof.

When a sealing material is used, the deposition of this sealing material is preferably made prior to the etching steps forming the channels 116, 112 and the cavities 110, 112 in the second substrate.

Once both substrates are secured to each other, the cover 114 can be thinned at its back face (face opposite to that in contact with the substrate 102). The remaining thickness of the cover at the bonding interface depends on the aspect ratio (AR) of the hole. It is for example possible to deposit metal at the bottom of the hole with an AR close to 10. For a hole with a diameter equal to about 10 µm, the remaining thickness of the cover is thus about 100 µm. For a hole with a diameter equal to about 100 µm, it is possible to reduce the cover thickness to reduce the etching time.

The holes 120 and 126 are then made by photolithography and etching, for example DRIE, through the cover 114 and such that the holes 120, 126 lead into the second ends 117B, 123B of the channels 116, 122. If the cover 114 has been previously oxidized in surface, the oxide layer formed can act as an etching stop layer. Etching this oxide layer in a dry way then enables the cavities 110, 112 to communicate with the outside environment via the channels 116, 122 and the holes 120, 126. Alternatively, the holes 120, 126 can be made after the channels 116, 122 by adding a lithography and etching level.

The hermetic closing of the cavities 110, 112 is then made as previously described in connection with FIGS. 2 and 3 via successive depositions of closing layers plugging the second ends 117B, 123B of the channels 116, 122 located at the holes 120, 126.

In order to achieve a well controlled atmosphere in the cavities 110, 112, it is possible to make, before depositing the closing layers 128, 136, a vacuum baking 110, 112 at a maximum temperature compatible with the materials present.

Alternatively to the making method described above, after making the channels 116, 122 and the cavities 110, 112 by photolithography and etching the second substrate, it is possible to make a thick deposition of material, for example a polyimide or BCB (Benzocyclobutene) type polymeric material, or an insulating material such as a silicon oxide deposited by CVD, filling the cavities 110, 112 and the channels 116, 122 previously defined in the second substrate. A CMP then enables to planarize the surface of the cover 114 at which this thick deposition is made and which is intended to be directly transferred onto the first substrate 102 by direct bonding. After both substrates are secured to each other, the possible thinning of the cover 114 and the etching of the holes 120, 126 in the cover 114, the material filling the cavities 110, 112 and the channels 116, 122 is removed, for example via an oxidizing plasma when the material to be removed is a polymer, or a vapor hydrofluoric acid when the material to be removed is a silicon oxide, through the holes 120, 126. Closing the cavities 110, 112 is then made as previously described by plugging the channels 116, 122. When the micro-devices are made from a sacrificial layer having a nature similar to that used to fill the channels and the cavities in the cover, it is possible to simultaneously release the cavities and devices after assembly. Therefore, they are protected throughout their manufacture. This alternative also enables a direct Si/Si or metal/metal sealing to be implemented, and thus to avoid pollution of the cavities by gases which would come from, for example, the soldering alloy melting.

According to another alternative of the method for making the structure 100, the parts of the cover 114 forming the different cavities 110, 112 and their associated channels 116, 122 can be made separate, for example by cutting a second substrate before their assembly onto the substrate 102. These separate covers can then be transferred and assembled onto the substrate 102 for example by using low temperature meltable soldering alloys (for example comprising lead, tin or indium) or by metal/metal direct sealing (for example Cu/Cu). The channels are plugged by the successive depositions 128 and 136.

Alternatively to the first embodiment previously described wherein the channels 116 and 122 are made by etching the second substrate forming the cover 114, these channels 116 and 112 can be formed in the thickness of the bonding interface between the substrate 114 and the substrate 102. Thus, a sealing bead, for example comprising a meltable soldering alloy (Au—Sn, Au—Si, Al—Ge) or advantageously a metal allowing a direct sealing (Cu, Ti, W) can ensure the securement of both substrates to each other, the channels 116, 122 being made within this sealing bead the thickness of which is for example at least equal to the largest height of the channels. It is also possible that the channels are made partly in the bonding interface and in the substrate 102 and/or in the second substrate.

Figure 4:
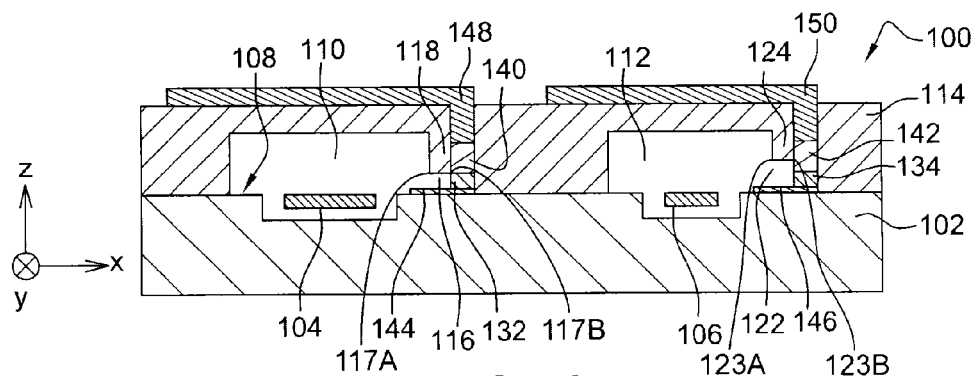
FIGS. 4 to 6 schematically represent the packaging structure according to the first embodiment and the cavities of which are closed in different ways.

FIG. 4 is a cross-section view of the structure 100 according to the first embodiment wherein the cavities 110, 112 are closed in a manner different from that previously described in connection with FIGS. 2 and 3.

In this alternative, the electrical connection elements 144 and 146 are provided on the front face 108 of the substrate 102 (a dielectric insulating layer, not represented in FIG. 4, is however provided between these elements 144 and 146 and the substrate 102) and are each electrically connected to the micro-devices 104 and 106 respectively. The elements 144, 146 each include a part provided facing one of the holes 120 and 126 such that the parts 132, 134, 140, 142 of the closing layers deposited are in contact with the elements 144 and 146. The closing layers used here include at least one electrically conductive material such as a metal, the micro-devices 104 and 106 being thus electrically connected to these parts 132, 134, 140 and 142 via the elements 144, 146. The parts 140 and 142 of the second closing layer also act as a seed layer for implementing an electrodeposition or any other deposition enabling the holes 120, 126 to be filled with an electrically conductive material, advantageously copper, and thus form electrical contacts 148, 150 connected to the micro-devices 104 and 106 and accessible from outside the cavities 110 and 112.

In this alternative, the cover 114 can be covered with a dielectric material (for example silicon oxide or nitride) prior to implementing the depositions of the closing layers, advantageously via a CVD deposition with a thickness lower than the smallest height of the channels 116, 122. The material of the first closing layer forming the parts 132 and 134 is a metal deposited by PVD under a controlled pressure of carrier gas (argon, krypton). The material of the second closing layer forming the parts 140 and 142 is metallic and able to act as a seed layer for a subsequent electrolytic deposition of the materials of the electrical contacts 148 and 150, for example gold, copper, nickel, etc. Prior to making the electrical contacts 148, 150, the parts of the closing layers deposited onto the second substrate (corresponding to the parts 130 and 138 in the example of FIG. 3) can also be removed for example via a CMP. The portions of the contacts 148 and 150 thus obtained laying on the upper face of the cover 114 (face opposite to that facing the upper face 108 of the substrate 102) are located in the holes 120, 126. It is then possible to rebuilt, on the upper face of the cover 114, a network of electrical lines in order to make an interconnection of the structure 100 with a chip or another substrate. In another alternative, it is possible to make a CMP on the layer 138 in order to perform thereafter a photolithography and an etching of a network of electrical lines on the upper face of the cover 114.

Figure 5:
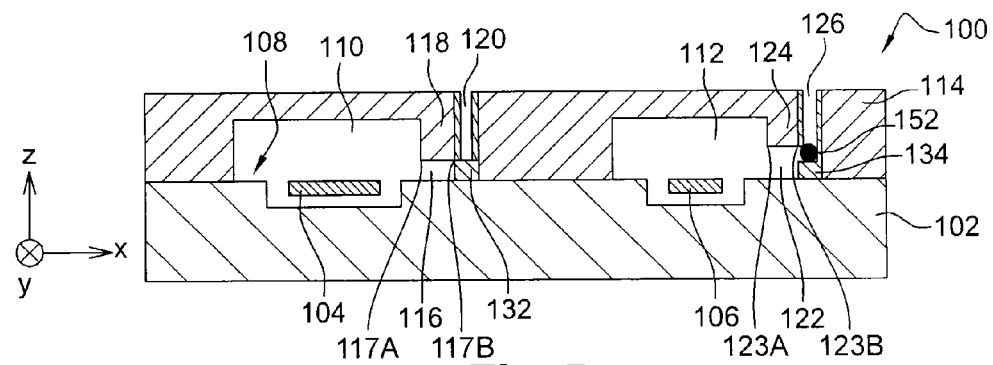

FIG. 5 is a schematic cross-section view of the structure 100 according to the first embodiment and wherein the cavities 110, 112 are closed in a manner different from that previously described in connection with FIGS. 2 to 4.

As for the structure 100 previously described in connection with FIGS. 2 and 3, the channel 116 the height $H_A$ of which is the smallest is plugged at its second end 117B via the deposition of the first closing layer with a thickness $E_1$ higher than the height $H_A$ of the channel 116 (and lower than the height $H_B$ of the channel 122 for the latter not to be plugged upon depositing this first closing layer). A part 132 of this first closing layer is deposited into the hole 120 and plugs the channel 116. Another part 134 of this first closing layer is deposited into the hole 126 but does not plug the channel 122. The first closing layer here includes a metal material which also covers the side walls of the holes 120 and 126. Moreover, the parts of this first closing layer deposited onto the face of the cover 114, apart from the holes 120, 126, are removed.

Unlike the structure 100 previously described in connection with FIG. 3 wherein the channel 122 is plugged via the deposition of a second closing layer, the channel 122 is here plugged at its second end 123B by introducing into the hole 126 a ball 152 of soldering material, or meltable material, the diameter of which is lower than the diameter (or than the dimensions parallel to the plane (X, Y)) of the hole 126. The diameter of the ball 152 is also higher than the remaining height ($H_B$–$E_1$) not plugged of the channel 122 for this ball 152 not to be capable of passing in the channel 122. Soldering this ball 152 under a chosen atmosphere enables the channel 122 to be plugged, and closes the cavity 112, by virtue of wetting the side walls of the hole 126 and the part 134 by the soldering material. Such a plugging of the channel 122 allows to reach higher pressure levels than those capable of being reached via depositing the second closing layer 136 as previously described in connection with FIGS. 3 and 4.

The first closing layer includes for example gold and the ball 152 includes a metal or meltable alloy such as indium, AuSn, Sn, etc. If a soldering material is used to secure the cover 114 to the substrate 102, the material of the ball 152 is selected such that its melting point is lower than that of the soldering material securing the substrates to each other for the soldering of the ball 152 not to cause the remelting of the material securing both substrates to each other.

Figure 6:
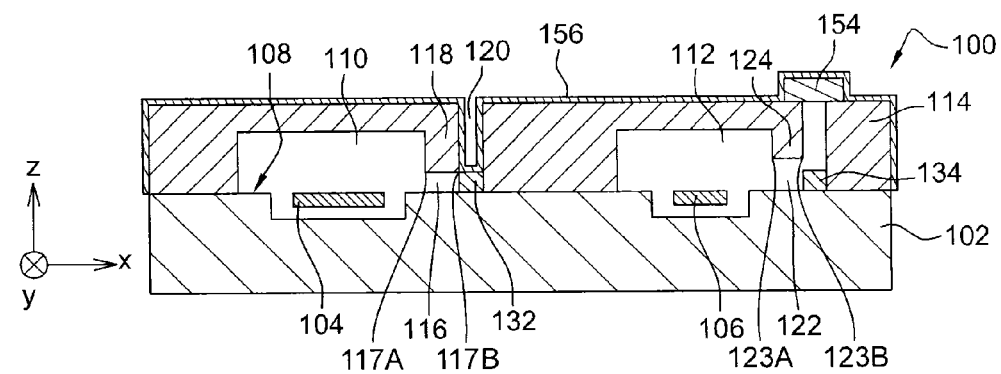

FIG. 6 is a schematic cross-section view of the packaging structure 100 according to the first embodiment wherein the cavities 110, 112 are closed in a manner different from that previously described in connection with FIGS. 2 to 5.

As for the structure 100 previously described in connection with FIGS. 2 and 3, the channel 116 the height $H_A$ of which is the smallest is plugged at its second end 117B via the deposition of a first closing layer with a thickness $E_1$ higher than the height $H_A$ of the channel 116 (and lower than the height $H_B$ of the channel 122 for the latter not to be plugged upon depositing this first closing layer). A part 132 of this first closing layer is deposited into the hole 120 and plugs the channel 116. Another part 134 of this first closing layer is deposited into the hole 126 but does not plug the channel 122. The parts of this first closing layer deposited onto the face of the cover 114 apart from the holes 120, 126 are removed.

In this alternative embodiment, the channel 122 is plugged via depositing a polymeric dry film the thickness of which is for example between a few microns and about 100 μm, being advantageously photosensitive, for example laminated on the upper face of the cover 114 under the wanted atmosphere at a pressure lower than about 1 bar. This dry film is then etched such that at least one remaining portion 154 is perpendicular to the hole 126 and forms a plug at the hole 126 on the upper face of the cover 114. The assembly previously made is then covered with a hermetic layer 156 deposited onto the cover 114, covering in particular the walls of the hole 120, the part 132 of the first closing layer being located in the hole 120 and the portion 154. The layer 156 includes for example silicon oxide or nitride, and/or a metal obtained by PVD or CVD (possibly strengthened by an ECD deposition) and the thickness of which can be for example between 0.1 μm and 10 μm.

In the structures previously described, one or more portions of getter material can be deposited into either or both cavities 110, 112, on one or several of the walls of the cavities, in order for example to obtain lower pressures in the cavities.

Figure 7A:
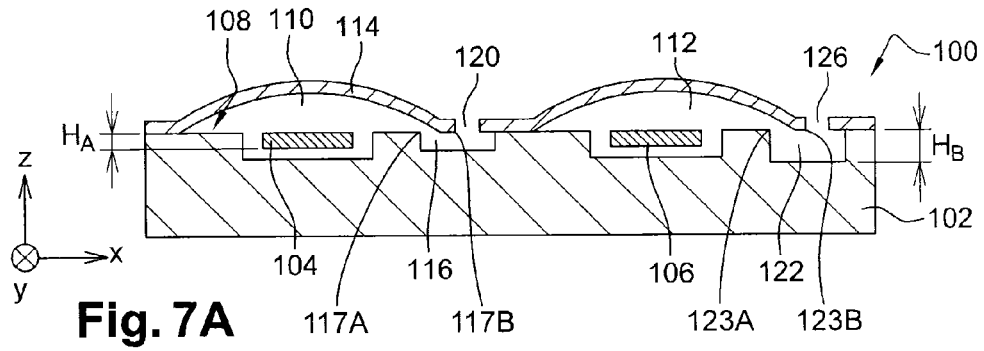
FIGS. 7A and 7B schematically represent a packaging structure according to a second embodiment.
Figure 7B:
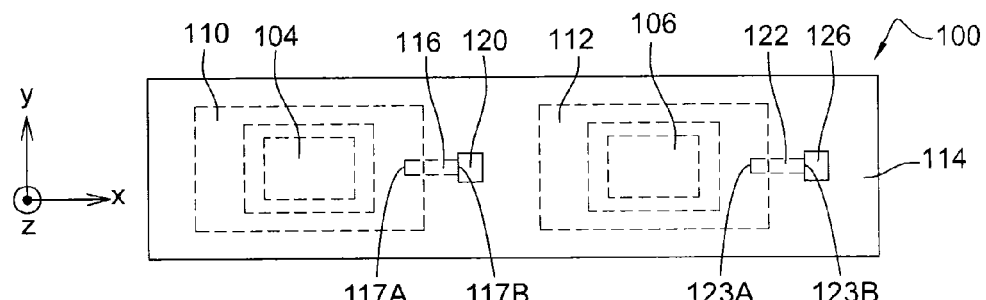

FIGS. 7A and 7B schematically represent a packaging structure 100 according to a second embodiment (FIG. 7A is a profile cross-section view and FIG. 7B is a top view of the structure 100).

In comparison with the first embodiment previously described, the cover 114 of the structure 100 according to the second embodiment does not correspond to a second substrate but to one or more thin layers deposited onto the front face 108 of the substrate 102 (TFP packaging). The cavities 110 and 112 are formed via portions of sacrificial material the volumes of which correspond to those of the cavities 110 and 112 intended to be made and on which the thin layer(s) forming the cover 114 is (are) deposited.

As in the first embodiment, the access to the inside of each of the cavities 110 and 112 of the structure 100 is made via a channel laterally extending such that it leads onto a side of one of the cavities 110, 112. In this second embodiment, the channels 116, 122 are formed on the substrate 102. The holes 120, 126 made through the cover 114 enable communication between the channels 116, 122 and the external environment of the structure 100. In the example of FIGS. 7A and 7B, the first channel 116 is formed by a first etched part of the substrate 102, at the front face 108 of the substrate 102, and leads into the first cavity 110 at a side thereof, at its first end 117A. The first channel 116 communicates with the first hole 120 formed through the thin layer(s) of the cover 114, at its second end 117B. Moreover, the second channel 122 is formed by a second etched part of the substrate 102, at its front face 108, and leads into the second cavity 112 at a side thereof, at its first end 123A. The channel 122 communicates with the second hole 126 formed through the thin layer(s) of the cover 114, at its second end 123B.

In the example of FIGS. 7A and 7B, the channels 116 and 122 horizontally extend in the substrate 102, that is extend along a direction parallel to the front face 108 of the substrate 102 (in parallel to the X axis in FIGS. 7A and 7B), from the first end 117A, 123A to the second end 117B, 123B. The holes 120 and 126 vertically extend through the cover 114, that is perpendicularly to the front face 108 of the substrate 102 and also perpendicularly to the external face of the cover 114 to which the holes 120 and 126 lead (in parallel to the Z axis in FIGS. 7A and 7B). The holes 120, 126 extend in a direction perpendicular to that along which the channels 116, 122 extend.

As in the first embodiment, in order to be able to successively close the cavities 110 and 112 with different atmospheres, the channels 116 and 122 have heights $H_A$ and $H_B$ which are different, with $H_A < H_B$. The etchings of the substrate 102 forming the channels 116 and 122 are thus made at different depths in order to obtain these different channel heights.

Figure 8:
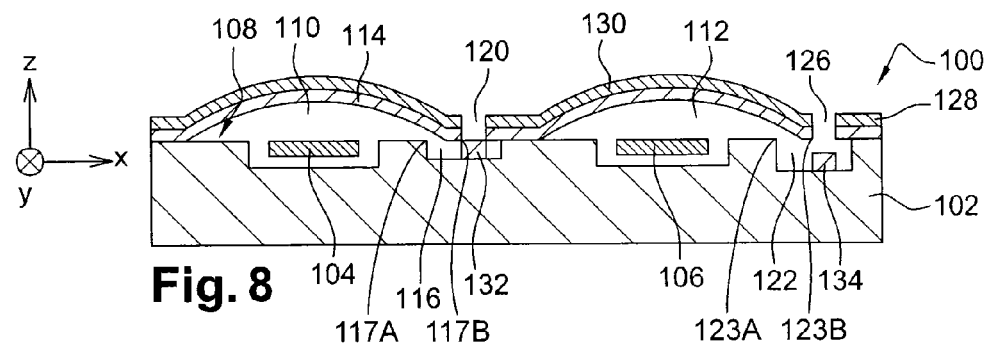
FIGS. 8 and 9 schematically represent steps of closing the cavities of the packaging structure according to the second embodiment.

FIG. 8 represents a first step implemented upon hermetically closing the cavities 110 and 112. As in the first embodiment, the first closing layer 128 is deposited, for example by a PVD deposition, onto the structure 100. Parts 130 of this layer 128 are deposited onto the cover 114 and other parts 132, 134 are deposited into the holes 120 and 126. Moreover, for the deposition of this layer 128 to hermetically close the cavity 110 (at the second end 117B of the channel 116) but not to close the cavity 112, the thickness $E_1$ of the layer 128 is selected such that $H_A < E_1 < H_B$. The part 134 deposited into the hole 126 does not plug the channel 122 the height $H_B$ of which is higher than the thickness $E_1$. This step of depositing the layer 128 is implemented under an atmosphere corresponding to that desired in the cavity 110, in terms of nature of the gas and pressure, for this atmosphere to end up in the cavity 110 after depositing the layer 128.

Figure 9:
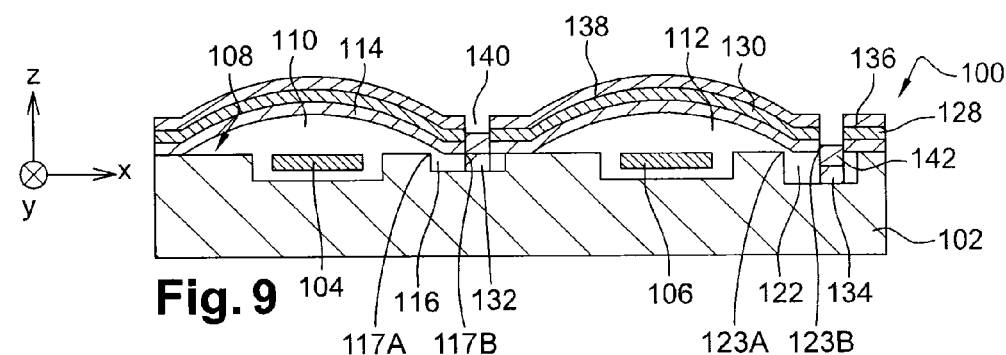

FIG. 9 represents a second step implemented upon hermetically closing the cavities 110 and 112. During this second step, the second closing layer 136 is deposited onto the layer 128. Thus, parts 138 of this layer 136 are deposited at the cover 114, onto the portions 130, and other parts 140, 142 are deposited into the holes 120 and 126, respectively on the parts 132 and 134 of the layer 128. Thus, the part 142 of the layer 136 deposited into the hole 126, onto the part 134 of the layer 128, plugs the channel 122 at its second end 123B and the height $H_B$ of which is lower than the sum of the thicknesses $E_1$ and $E_2$. This step of depositing the layer 136 is implemented under an atmosphere corresponding to that desired in the cavity 112 such that this atmosphere ends up the cavity 112 after depositing the layer 136. Moreover, given the low thickness of the cover 114, the holes 120 and 126 are here wholly plugged by the portions 132, 134, 140, and 142.

Both closing layers 128 and 136 used in this second embodiment are for example similar to those previously described in connection with the first embodiment.

Prior to the implementation of the steps of depositing the layers 128 and 136, the structure 100 according to the second embodiment is for example made by the implementation of the steps described below.

The micro-devices 104 and 106 are first made in the substrate 102.

The channels 116 and 122 are then made in the substrate 102 by photolithography and etching.

A layer of sacrificial material, including for example a polymer and having a thickness between about 1 μm and 100 μm, is then deposited onto the front face 108 of the substrate 102, by covering the micro-devices 104 and 106. The sacrificial material can be a photosensitive resin which is shaped by exposure through a mask and etched such that remaining portions of this sacrificial material correspond to the volumes of the cavities 110 and 112 intended to be made. Each of the remaining portions of the sacrificial material covers at least one part of one of the channels 116 and 122. The thin layer (or the thin layers) forming the cover 114 is then deposited onto the substrate 102 by covering the portions of sacrificial material. This thin layer can include a dielectric (SiO$_2$ or SiN for example) deposited for example by CVD, or a metal deposited by PVD. Several thin layers can be successively deposited to form the cover 114, wherein these layers can be of different natures with respect to each other. The thin layer or each of the thin layers can include a thickness between about 1 μm and a few microns.

The holes 120 and 126 are then made through the cover 114, and then the sacrificial material laying below the cover 114 is etched through these holes, for example via an oxidizing plasma. Besides the removal of the sacrificial material forming the cavities 110, 112, this etching step can also release the micro-devices 104, 106 if sacrificial material is present around these micro-devices at this stage of the method.

The channels 116, 122 are then plugged as previously described in connection with FIGS. 8 and 9.

Alternatively to the second embodiment in which the channels 116 and 122 are made in etched parts of the substrate 102, these channels can be made in the thin layers forming the cover 114.

Figure 10A:
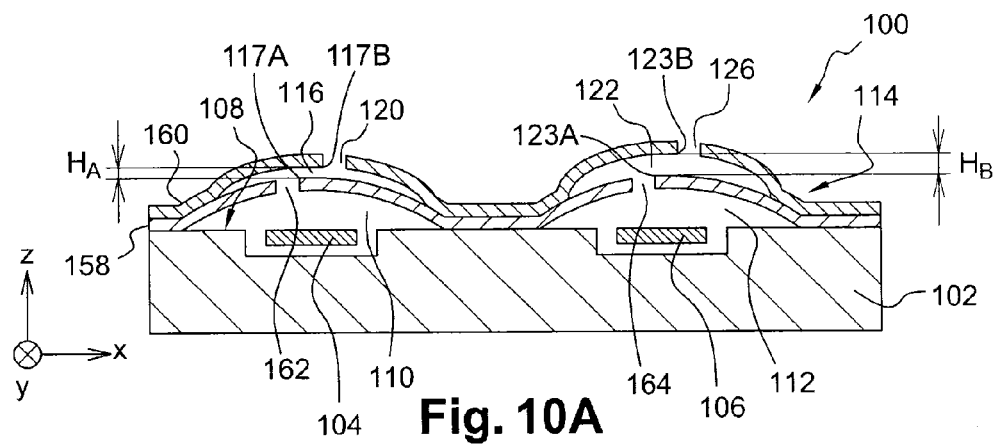
FIGS. 10A to 10C schematically represent a packaging structure according to an alternative of the second embodiment.

FIG. 10A represents such a cover 114 in which the channels 116 and 122 are made. The cover 114 is formed by at least two thin layers superimposed above each other, here a first lower layer 158 and a second upper layer 160.

For the part of the cover 114 formed at the first cavity 110, the hole 120 is made through the layer 160. The channel 116 is formed by a space with a height $H_A$ laying between both layers 158 and 160. The channel 116 enables communication between the outside of the cavity 110 via the hole 120. A hole 162 made through the layer 158 enables communication between the channel 116 and the inside of the cavity 110.

For the part of the cover 114 formed at the second cavity 112 intended to be subsequently closed to the first cavity 110, the hole 126 is made through the layer 160. The channel 122 is formed by a space with a height $H_B$ laying between both layers 158 and 160. The channel 122 communicates with the outside of the cavity 112 via the hole 126. A hole 164 made through the layer 158 enables communication between the channel 122 and the inside of the cavity 112.

The holes 162 and 164 have for example, in a plane parallel to the front face 108 of the substrate 102 (plane parallel to the plane (X, Y)), cross-sections having shape and dimensions similar to those of the holes 120 and 126.

Figure 10B:
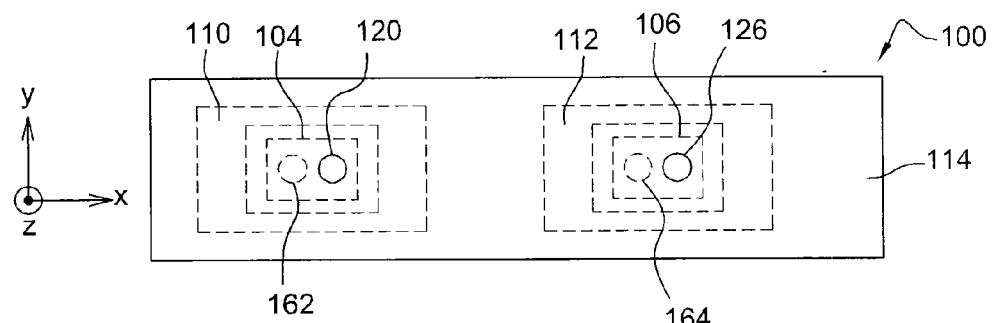

FIG. 10B represents a top view of such a structure 100.

Figure 10C:
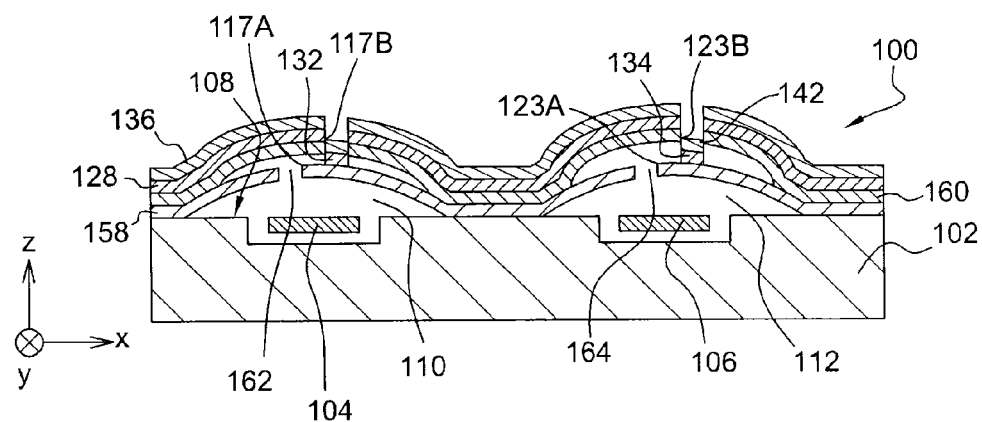

FIG. 10C represents the structure 100 in which the channel 116 is plugged, at its second end 117B, from the outside by the part 132 of the first closing layer, and the channel 122 is plugged, at its second end 123B, from the outside by the parts 134 and 142 of both closing layers.

Such a cover 114 can be made by depositing the first layer 158 onto the portions of sacrificial material defining the volumes of the cavities 110, 112. The holes 162 and 164 are then made by photolithography and etching through the layer 158. A first layer of sacrificial material, for example of resin and preferably of the same nature as the material of the portions defining the volumes of the cavities 110, 112, is then deposited onto the layer 158. This first layer of sacrificial material has a thickness equal to $H_A$. A photolithography and an etching of this first layer of sacrificial material are then made in order to preserve a remaining portion of this first layer of sacrificial material only at the channel 116. A second layer of sacrificial material with a thickness equal to $H_B$ is then deposited at the channel 122 on the parts of the layer 158 which are not covered with this remaining portion. Thus, the thickness of sacrificial material present on the layer 158 is modulated depending on the desired heights of the channels. Photosensitive resins having opposite polarities are advantageously used to make the first and second layers of sacrificial material. The layer 160 is then deposited onto these sacrificial materials. The holes 120 and 126 are made through the layer 160 by photolithography and etching. The sacrificial material laying between both layers 158 and 160 as well as the sacrificial material present under the layer 158 are then etched, for example by an oxidizing plasma, through the holes 120 and 126. The channels are then plugged as previously described.

In all the previously described embodiments and alternatives, for micro-devices intended to operate under a very high vacuum, for example lower than about $10^{-4}$ mbar, the channels can be plugged under a secondary vacuum by a metal deposition, for example a getter material such as titanium or zirconium. It is also possible that the first closing layer 128 and/or the thin layer(s) forming the cover in the second embodiment include at least one getter material. The use of a getter material to make the plugging of one of several channels enables higher vacuums to be obtained, for example close to about $10^{-6}$ mbar, by virtue of the gas absorption/adsorption made by the getter.

In the previously described embodiments and alternatives, two distinct cavities are successively closed, the first cavity being closed via a first deposition which hermetically closes a single of both cavities. The second cavity is then hermetically closed by a distinct step. Generally, the structure 100 can include n cavities, with n being an integer higher than or equal to 2. Each of these n cavities includes a channel forming an access to the cavity, the channels having heights different with respect to each other. Some channels can have similar heights. Thus, the n channels can be made with m different heights, with 2≤m≤n. These channels can be hermetically plugged by implementing m successive depositions of closing material, each deposition hermetically closing a cavity or several cavities via plugging access channels which have similar heights. By considering n channels with heights $H_1$ to $H_m$, the m successive depositions of heights $E_1$ to $E_m$ are thus such that $$H_i < \sum_{j=1}^{m-1} E_j < H_{i+1} < \sum_{j=1}^{m} E_j.$$

The invention claimed is:

1. A packaging structure including:
   at least one cover secured to at least one first substrate and forming at least first and second distinct cavities between the cover and the first substrate,
   at least first and second channels formed in the first substrate and/or in the cover and/or between the first substrate and the cover, such that the first channel includes a first end leading into the first cavity and a second end leading off the first cavity via at least one first hole formed through the cover, and in that the second channel includes a first end leading into the second cavity and a second end leading off the second cavity via at least one second hole formed through the cover,
   wherein a height $H_A$ of the first channel at its second end is lower than a height $H_B$ of the second channel at its second end,
   wherein the second end of the first channel is plugged by at least one first portion of a first closing layer with a thickness $E_1$ higher than the height $H_A$ and lower than the height $H_B$, and wherein the second end of the second channel is plugged by at least:
   one second portion of the first closing layer and a portion of a second closing layer with a thickness $E_2$ such that $H_B<(E_1+E_2)$, or
   the second portion of the first closing layer and a portion of a material soldered to the second portion of the first closing layer and with a thickness $E_2$ such that $H_B<(E_1+E_2)$, or
   the second portion of the first closing layer and a portion of a plugging layer plugging the second hole on the cover.

2. The packaging structure according to claim 1, wherein the difference between the heights $H_A$ and $H_B$ is such that it is possible to close the first channel via depositing a closing layer at the second ends of the first and second channels without closing the second channel.

3. The packaging structure according to claim 1, wherein at least one first micro-device is provided in the first cavity and/or wherein at least one second micro-device is provided in the second cavity.

4. The packaging structure according to claim 1, wherein:
   at least one first micro-device is provided in the first cavity and/or wherein at least one second micro-device is provided in the second cavity, and
   when the first micro-device is provided in the first cavity, the first closing layer includes at least one electrically conductive material, the packaging structure including at least one first electrical connection element connected to the first micro-device and to the first portion of the first closing layer, and at least one first electrical contact provided at least partly in the first hole and connected to the first portion of the first closing layer, and/or
   when the second micro-device is provided in the second cavity, the materials plugging the second end of the second channel are electrically conductive, the packaging structure including at least one second electrical connection element connected to the second micro-device and to the second portion of the first closing layer, and at least one second electrical contact provided at least partly in the second hole and connected to the portion of the second closing layer or to the portion of the material soldered to the second portion of the first closing layer.

5. The packaging structure according to claim 1, wherein the first channel passes through at least one side wall of the first cavity and/or wherein the second channel passes at least through a side wall of the second cavity.

6. The packaging structure according to claim 1, wherein the cover includes at least one substrate called a second substrate secured to the first substrate and such that the first and second cavities are formed at least partly in the second substrate.

7. The packaging structure according to claim 6, wherein the second substrate is secured to the first substrate via a bonding interface provided between the first substrate and the second substrate and such that the first and second channels are formed at least partly in the bonding interface.

8. The packaging structure according to claim 1, wherein the cover includes at least one thin layer provided on the first substrate, and wherein the first and second channels are formed at least in the first substrate.

9. The packaging structure according to claim 1, wherein the cover includes at least two thin layers superimposed above each other and provided on the first substrate, and wherein the first and second channels are formed at least by spaces between both thin layers.

10. A method for making a packaging structure, including making at least one cover secured to at least one first substrate forming at least first and second distinct cavities between the cover and the first substrate, and making at least first and second channels in the first substrate and/or in the cover and/or between the first substrate and the cover, such that the first channel includes a first end leading into the first cavity and a second end leading off the first cavity via at least one first hole formed through the cover, and in that the second channel includes a first end leading into the second cavity and a second end leading off the second cavity via at least one second hole formed through the cover, wherein a height $H^A$ of the first channel at its second end is lower than a height $H_B$ of the second channel at its second end, further including, after making the cover and the first and second channels, depositing at least one first closing layer with a thickness $E_1$ higher than the height $H_A$ and lower than the height $H_B$ such that at least one first portion of the first closing layer plugs the second end of the first channel, and then:

depositing at least one second closing layer with a thickness $E_2$ such that $H_B<(E_1+E_2)$ and in that at least one second portion of the first closing layer and a portion of the second closing layer plugs the second end of the second channel, or depositing at least one portion of soldering material with a thickness $E_2$ such that $H_B<(E_1+E_2)$ onto the second portion of the first closing layer, and then soldering the portion of soldering material, or making at least one portion of plugging layer plugging the second hole on the cover.

11. The method according to claim 10, wherein making the cover and the first and second channels includes at least the implementation of the following steps of:

making first and second channels at a face of a second substrate intended to be secured to the first substrate;

making first and second cavities at said face of the second substrate;

securing said face of the second substrate to the first substrate;

making first and second holes through the second substrate, wherein the first channel passes at least through a side wall of the first cavity and/or wherein the second channel passes at least through a side wall of the second cavity.

12. The method according to claim 10, wherein making the cover and the first and second channels includes at least the implementation of the following steps of:

making first and second cavities at one face of a second substrate intended to be secured to the first substrate;

making a bonding interface on said face of the second substrate and/or a face of the first substrate to which the second substrate is intended to be secured, the first and second channels being formed at least partly in the bonding interface;

securing said face of the second substrate to the first substrate via the bonding interface;

making the first and second holes through the second substrate.

13. The method according to claim 10, wherein making the cover and the first and second channels includes at least the implementation of the following steps of:

making first and second channels in the first substrate;

making first and second portions of sacrificial material on the first substrate, volumes of which correspond to those of the first and second cavities and such that the first portion of sacrificial material covers at least one part of the first channel and in that the second portion of sacrificial material covers at least one part of the second channel;

depositing at least one thin layer onto the first and second portions of sacrificial material;

making first and second holes through the thin layer;

etching the first and second portions of sacrificial material through the first and second holes.

14. The method according to claim 10, wherein making the cover and the first and second channels includes at least the implementation of the following steps of:

making first and second portions of sacrificial material on the first substrate, volumes of which correspond to those of the first and second cavities;

depositing at least one first thin layer onto the first and second portions of sacrificial material;

making third and fourth holes through the first thin layer, the third hole being formed at a location of the first end of the first channel intended to be made and the fourth hole being formed at a location of the first end of the second channel intended to be made;

making, on the first thin layer, at least one third portion of sacrificial material a thickness of which is equal to the height $H_A$, at least at a location of the first channel, and at least one fourth portion of sacrificial material a thickness of which is equal to the height $H_B$, at least at a location of the second channel;

depositing at least one second thin layer onto the first thin layer, covering the third and fourth portions of sacrificial material;

making first and second holes through the second thin layer;

etching first, second, third and fourth portions of sacrificial material through at least the first and second holes.

* * * * *